United States Patent [19]
Schrenk

[11] Patent Number: 4,941,034
[45] Date of Patent: Jul. 10, 1990

[54] INTEGRATED SEMICONDUCTOR CIRCUIT

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 218,493

[22] Filed: Jul. 5, 1988

Related U.S. Application Data

[63] Continuation of Ser. No. 921,756, Oct. 22, 1986.

[30] Foreign Application Priority Data

Oct. 22, 1986 [DE] Fed. Rep. of Germany ....... 3537590

[51] Int. Cl.$^5$ .................... H01L 23/48; H01L 29/46; H01L 29/54
[52] U.S. Cl. ........................................ 357/71; 357/72
[58] Field of Search ................ 357/71, 65, 72

[56] References Cited

U.S. PATENT DOCUMENTS

| | | | |
|---|---|---|---|
| 3,632,436 | 1/1972 | Denning | 357/71 |
| 3,681,147 | 8/1972 | Dhaka et al. | 357/71 |
| 3,714,521 | 1/1973 | Shaw | 357/71 |
| 4,356,622 | 11/1982 | Widmann | 357/71 S |
| 4,611,237 | 9/1986 | Ohuchi et al. | 357/71 R |
| 4,618,878 | 10/1986 | Aoyama et al. | 357/71 |

FOREIGN PATENT DOCUMENTS

| | | | |
|---|---|---|---|
| 0122631 | 10/1984 | European Pat. Off. | 357/71 |
| 60-79748 | 5/1985 | Japan | 357/71 |
| 81/02222 | 9/1981 | PCT Int'l Appl. | 357/71 |

*Primary Examiner*—Rolf Hille
*Assistant Examiner*—Hoanganh Le
*Attorney, Agent, or Firm*—Herbert L. Lerner; Laurence A. Greenberg

[57] ABSTRACT

An integrated semiconductor circuit includes a substrate; a layer of electrical structures disposed in the substrate; conductor runs connected to the electrical structures; at least one electrically conducting surface element covering part of the electrical structures, part of the substrate and part of the conductor runs defining first conductor runs covered by the at least one surface element and second conductor runs; an insulating layer electrically separating the at least one surface element from first the conductor runs; and a passivating layer covering the substrate, the electrical structures, the conductor runs and the at least one surface element; the at least one surface element having at least the same thickness and the same chemical properties as the conductor runs; and the passivating layer being at least as thick above the at least one surface element covering the first conductor runs as above the second conductor runs.

7 Claims, 3 Drawing Sheets

INTEGRATED SEMICONDUCTOR CIRCUIT

This application is a continuation of application Ser. No. 921,756, filed Oct. 22, 1986, now abandoned.

The invention relates to an integrated semiconductor circuit, including a substrate having a layer of electrical structures, conductor runs for connecting the electrical structures, at least one electrically conducting surface element covering the substrate and the electrical structures, and a passivating layer covers the substrate, the electrical structures, the conductor runs and the surface element.

As is well known, MOS circuits are produced in several process steps, during which the semiconductor substrate to be used is structured in the desired manner Conversely, the function and property of the circuit can be determined by an analysis of the structure. It is possible to carry out a light-optical analysis by means of a light microscope. In this manner, the information stored in a ROM, for instance, can also become known In electrically programmable memories ($E^2$PROMs), the memory content can be subjected to an electrical analysis, such as by scanning the charging state of the memory cells with electron beams and by examining the potential contrast Indirect analysis by reaction of the memory state on the periphery logic which is required to be wired to the memory, can also not be precluded. An example of this is the measurement of the potential on the column lines after a memory address is established. Such measurements assume that the surface is completely exposed and can be scanned electro-optically.

However, there are applications for integrated circuits, in which an analysis of the circuit and of the memory content by unauthorized persons must be prevented. Examples of applications of this are security and access systems, accounting and registration systems and debit or credit systems, in which so-called chip cards are employed. In such a case, data which are stored on every card are to be checked prior to each use of the card and are to prevent misuse of the card. In addition, each chip is to be provided with a special security logic circuit which is to block the trigger circuit of the memory or is to make reading-out dependent on a release procedure. The possibility of performing an analysis of the circuit or the memory content with fraudulant intent, can therefore jeopardize the reliability of the system under consideration.

Attempts have been made to limit the analysis of such circuits. For instance, German Published, Non-Prosecuted Application DE-OS 30 44 983 discloses a method of filling regions between conductor runs with metallic surface elements which lie in the same plane as the conductor runs and are not electrically connected to the conductor runs. The same publication also describes how to change and enlarge the area of the conductor runs so that to an observer they no longer perform like conductor runs, but rather like electrical shielding surfaces. In individual cases, these measures may temporarily confuse an expert who wants to analyze circuits provided with such measures and the electrical states thereof, but this known measure does not provide serious and reliable protection from systematically carried out analyses. For instance, after cover and passivating layers located above the conductor runs have been etched off down to the conductor runs, the circuits can then be examined light-optically and/or by means of methods for determining potential contrasts, at any time.

It is accordingly an object of the invention to provide an integrated semiconductor circuit which overcomes the hereinafore-mentioned disadvantages of the heretofore-known devices of this general type, with which an electrical analysis of the circuit and the state of the circuit is prevented.

With the foregoing and other objects in view there is provided, in accordance with the invention, an integrated semiconductor circuit, comprising a substrate: a layer of electrical structures disposed in the substrate; conductor runs connected to the electrical structures: at least one electrically conducting surface element covering part of the total surface of the integrated semiconductor circuit, part of the electrical structures, part of the substrate and part of the conductor runs defining first conductor runs covered by the at least one surface element and second conductor runs not covered by the surface element; an insulating layer electrically separating the at least one surface element from first the conductor runs: and a passivating layer and optionally other cover layers covering the substrate, the electrical structures, the conductor runs and the at least one surface element; the at least one surface element having the same or greater thickness and the same chemical properties as the conductor runs; and the passivating layer being at least as thick above the at least one surface element covering the first conductor runs as above the second conductor runs.

In accordance with another feature of the invention, the conductor runs and the at least one surface element are formed of metal, preferably aluminum.

In accordance with a further feature of the invention, the conductor runs and the at least one surface element are formed of a material from the group consisting of polysilicon and metal silicides.

In accordance with an added feature of the invention, the at least one surface element exclusively covers part of the conductor runs.

In accordance with an additional feature of the invention, the at least one surface element is in the form of a plurality of surface elements and at least one of the surface elements is electrically insulated.

In accordance with yet another feature of the invention, the at least one surface element is in the form of a plurality of surface elements and at least one of the surface elements is connected to a potential serving as a voltage supply for the semiconductor circuit.

In accordance with yet a further feature of the invention, the at least one surface element is in the form of a plurality of surface elements and several of the surface elements are connected to each other.

In accordance with yet an added feature of the invention, the at least one surface element is in the form of a plurality of surface elements including first and second surface elements, the first surface element is connected to a first potential serving as a voltage supply for the semiconductor circuit and the second surface element is connected to a second potential serving as a voltage supply for the semiconductor circuit.

In accordance with yet an additional feature of the invention, the at least one surface element is in the form of a plurality of surface elements, at least one of the surface elements being a conductor connected to part of the electrical structures.

In accordance with still another feature of the invention, the at least one surface element is connected to the part of the electrical structures through contact holes, which may be formed in an intermediate oxide layer between the at least one surface element and the electrical structures.

In accordance with still a further feature of the invention, the circuit is constructed with multilayer wiring techniques.

In accordance with still an added feature of the invention, there is provided a first area containing the second conductor runs and being free of the at least one surface element, and a second area containing the first conductor runs and the at least one surface element.

In accordance with still an additional feature of the invention, there are provided circuit parts in the first area representing a security logic circuit and there are provided other circuit parts, the security logic circuit operating as a function of or in dependence on an expected term fed to the integrated semiconductor circuit, for allowing at least part of the other circuit parts to function electrically and for preventing operation if the expected term fails to arrive and if a term is fed-in which is different from the expected term.

In accordance with again another feature of the invention, there are provided additional circuit parts in the first area which are basically required for the proper operation of the integrated semiconductor circuit, independently of the security logic circuit.

In accordance with a concomitant feature of the invention, there are provided circuit parts in the second area, a portion of the conductor runs associated with the circuit parts in the second area having logic levels relevant for the integrated semiconductor circuit.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
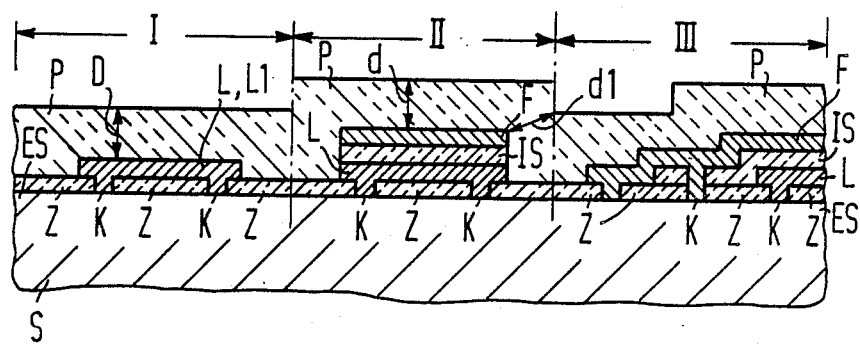
FIG. 1 is a fragmentary, diagrammatic, cross-sectional view of an integrated semiconductor circuit according to the invention.

Referring now to the figures of the drawings in detail and first, particularly, to FIG. 1 thereof, there is seen a semiconductor crystal which may be formed of silicon or gallium arsenide, for example, and forms a substrate S which serves as a mechanical support for the entire integrated semiconductor circuit. As is customary in integrated semiconductor circuits, electrical structures ES are disposed in the vicinity of one of the main or principal surfaces of the substrate S. The structures are the individual components of an integrated semiconductor circuit such as transistors, capacitors, resistors and diodes. For reasons of clarity, the presentation of individual structures ES is dispensed with in FIG. 1; the reference symbol ES only indicates the area in which the structures ES are located. Conductor runs L connect the individual electrical structures to each other, so that the respectively desired circuit is obtained. In order to prevent undesirable short circuits between the conductor runs L and the electrical structures ES, a so-called intermediate oxide layer Z is furthermore located between the conductor runs L and the electrical structures ES. During the fabrication of the integrated semiconductor circuit, the intermediate oxide layer can be grown as a thermal oxide, for instance. The conductor runs L are connected to the electrical structures ES through contact holes K. At least one passivating layer P and optionally other non-illustrated cover layers are disposed above the conductor runs L and the intermediate oxide layer Z. An integrated semiconductor circuit constructed in this manner has no protection of any kind against analyses. Even the instantaneous state of the circuit, i.e., the memory content, can be determined and evaluated, especially in non-volatile semiconductor memories. An integrated semiconductor circuit according to the state of the art therefore has surface elements which extend laterally relative to the conductor runs down to a certain spacing, in the same plane in which the conductor runs L are located, i.e., above the electrical structures ES. However, as already explained, this provides no protection against analysis and the reading-out of data, since the conductor runs L are exposed and are fully accessible after the removal of the passivating layer P.

On the other hand, the integrated semiconductor circuit according to the invention includes one or more surface elements F between the plane of the conductor runs L and the passivating layer P, which meet the following minimum requirements: 1. They cover part of the entire surface of the integrated circuit, so that part of the conductor runs L, part of the substrate S and part of the electrical structures ES are covered. This means that the surface elements F are at least partially in a different plane than the conductor runs L. 2. They are electrically separated from the covered conductor runs L by an insulating layer IS. 3. The surface elements F have at least the same thickness as the conductor runs L. 4. They have the same chemical properties as the conductor runs L, i.e., they especially exhibit the same behavior as the conductor runs L as far as etching treatments are concerned.

The passivating layer P and the optionally provided cover layers exhibit a further property according to the invention: At least at locations in which the surface elements F cover first conductor runs L, the layer P and other cover layers have at least the same or greater thickness d than the thickness D thereof at locations above second conductor runs L1 which are free of coverage by surface elements F. It is also advantageous for the passivating layer P to have a minimum thickness d1, at which a surface element F ends in its lateral dimension, which is at least equal to the thickness d at lateral edges of such conductor runs L covered by a surface element F.

Such an integrated semiconductor circuit according to the invention is very largely protected against optical and/or electrical analysis. The way in which this protection operates will be explained below. It will be assumed as an example that the integrated semiconductor circuit shown in FIG. 1 is a non-volatile semiconductor memory circuit in the form of an E$^2$PROM. The area designated with reference numeral I in FIG. 1 is assumed to represent a security logic circuit that may be contained in the semiconductor memory circuit for preventing unauthorized electrical access to the data stored in the memory circuit, such as by processing a secret code which can be fed-in externally. Instead of or in addition to the security logic circuit, the area I can also contain components basically necessary for the operation of the semiconductor circuit such as clock generators or substrate bias generator circuits. These circuits and components are connected to each other as electrical structures ES by means of conductor runs and are connected to the remaining parts of the integrated semiconductor circuit. This is shown in a highly diagrammatic manner as a single conductor run L1. According to the invention, the area I is free of the surface elements F. An area II represents an area which may contain the memory cell field belonging to the semiconductor memory circuit, as well as components peripheral thereto, the corresponding conductor runs L thereof at least partially having logic levels which correspond either to data read out from the memory cell field or to relevant data important for the memory cell field (such as addressing signals). The area II has at least one surface element F. Accordingly, it exclusively covers part of all of the conductor runs L of the integrated semiconductor circuit.

An area III will be considered later below.

If one attempts to analyze or read out the semiconductor memory without authorization (it is assumed that unauthorized "simple readout" is prevented by the above-mentioned security logic circuit incorporated into the integrated circuit), such a person will generally attempt to separate the passivating layer P and a further cover layer that may be present (such as by etching). Due to the layer thickness conditions given above (dimensions d, D, d1), the passivating layer P above the conductor run L1 is removed no later than the instant at which the passivating layer above the surface element F in the area II is removed. Although the area I is then freely accessible, nothing can be analyzed, since it does not contain conductor runs which assume logic levels that correspond to the memory content. In area II, in which peripheral circuit parts are assumed to be located as well as the memory cell field of the semiconductor memory, the surface element F prevents access required for analysis purposes, (such as by applying certain voltages to the outputs of certain decoders, the function of which is blocked by the security logic circuit). Therefore, the only procedure remaining is to likewise etch away the surface element F or the surface elements F in the area II, including the insulating layer IS therebelow. However, since the conductor run L1 which is exposed in the area I at this point in time and is therefore accessible to the etchant, is also at most as thick as the surface element F and since it exhibits the same chemical properties as the latter (F) especially regarding the etching behavior, the conductor run L1 is also simultaneously etched away in the area I when the surface element F in the area II is being etched off. Although the peripheral circuit parts and the storage cell field in the area II are accessible in the final condition, an analysis is nevertheless impossible, since the conductor runs which are indicated in FIG. 1 by the conductor run L1, are destroyed (etched away) in the area I. Thus, the circuit parts located in the area I can no longer function, which renders any operation in the area II impossible. As expressed in a single sentence: During an attempt to anaylze an integrated semiconductor circuit according to the invention, the circuit is intentionally and reliably destroyed due to its advantageous construction or, in the case of non-volatile semiconductor memories, they are destroyed during an attempt to read out the content thereof.

The integrated semiconductor circuit according to the invention is easy to produce by conventional means: The electrical structures ES and the intermediate oxide Z can be produced by conventional process steps. The conductor runs L, the insulating layers IS and the surface elements F can be produced by conventional process steps concerning the manufacture of multilayer wiring in integrated circuits. In this case, the conductor runs L are applied as a first metallizing plane and are structured in accordance with the respective circuit requirements. For instance, plasma oxide is available as the insulating layer IS. Thermally grown oxide cannot be used because the conductor runs L underneath would burn up due to the temperatures that occur. Since the surface elements F are to exhibit the same chemical properties as the conductor runs L, especially as far as the etching behavior is concerned, they are advantageously formed of the same material as the conductor runs L. They are accordingly applied as a second metallization plane, preferably with the same thickness as the first metallization plane for the conductor runs L and are structured according to the requirements of the desired protection.

It is advantageous for the conductor runs L, L1 as well as the surface elements to be formed of metal and in particular, of aluminum. It is also advantageous for the conductor runs L, L1 as well as the surface elements F to be formed of polysilicon or of high-melting silicides. It is also advantageous to place the surface elements F in such a manner that they exclusively cover conductor runs L and more specifically, a part of the conductor runs L (as seen in area II of FIG. 1). According to a first embodiment of the invention, the surface elements F are electrically insulated from the integrated circuit.

According to a second embodiment of the invention, the surface elements F are eletrically connected to a potential serving as the voltage supply for the integrated semiconductor circuit. Furthermore, several surface elements F can be connected to each other. According to a further embodiment of the invention, a first surface element F can be connected to a first potential serving as the voltage supply for the integrated semiconductor circuit, while a second surface element F is connected to a second potential likewise serving as a voltage supply for the integrated semiconductor circuit.

A special embodiment of the invention is shown in the area III in FIG. 1. As is shown in FIG. 1, the embodiment shown in area III can be combined with the above-mentioned embodiments of the invention shown in area II of FIG. 1. However, it can also be used independently, so that in a cross-sectional presentation analogous to illustration of FIG. 1, the area II would be omitted, i.e., a corresponding integrated semiconductor circuit would only be formed of areas I and III.

In the embodiment of the invention shown in area III in the figures, at least a part of the surface elements F is used at the same time as conductor runs of a second metallization plane. The embodiment only differs essentially from the above-mentioned embodiment by providing corresponding contact holes K between the surface elements F acting as conductor runs and part of the electrical structures ES. According to a further embodiment of the invention, the contact holes K are formed through the intermediate oxide Z and also partially through the insulating layer IS.

As already described above, conventional multilayer wiring technologies are used for fabricating the integrated semiconductor circuit according to the invention.

Figure 2:
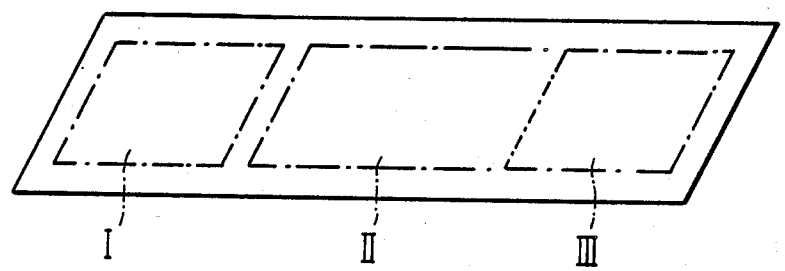
FIG. 2 is a top-plan view of another embodiment of the circuit.
Figure 3:
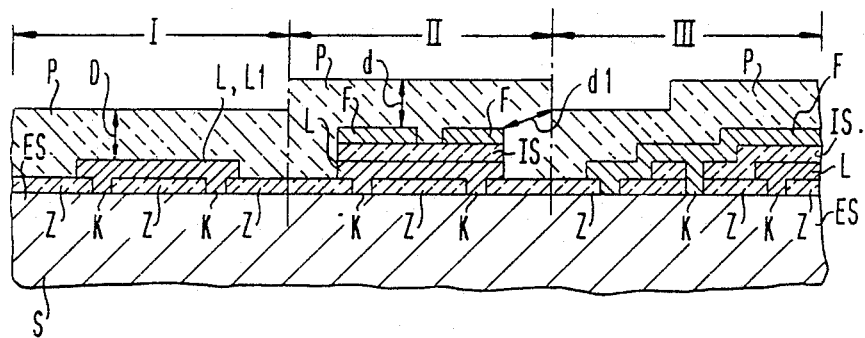
FIGS. 3, 4, 5 and 6 are fragmentary, diagrammatic, cross-sectional view of an integrated semiconductor circuit according to the invention.
Figure 4:
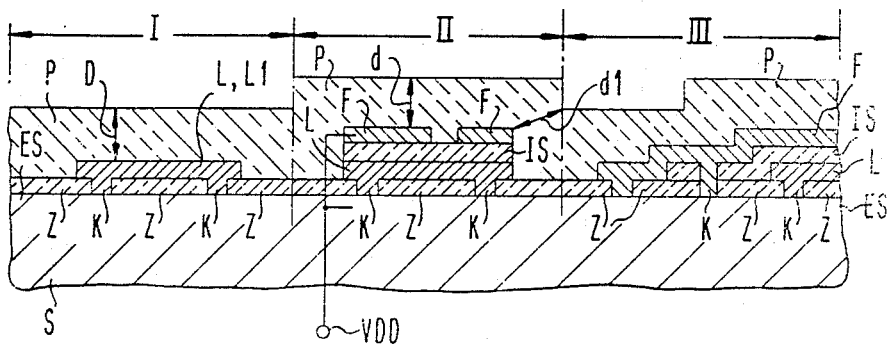
Figure 5:
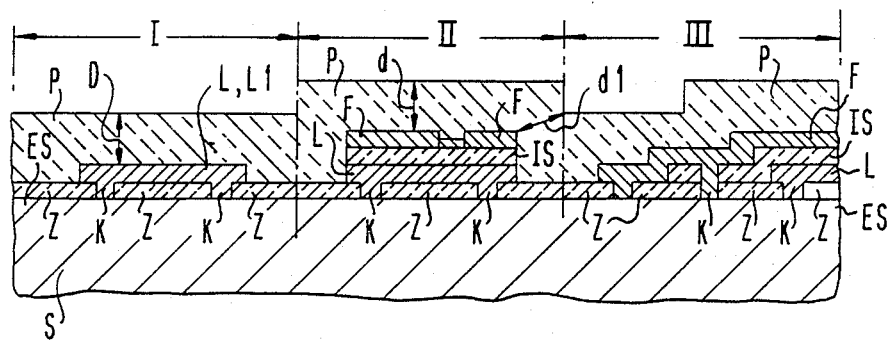
Figure 6:
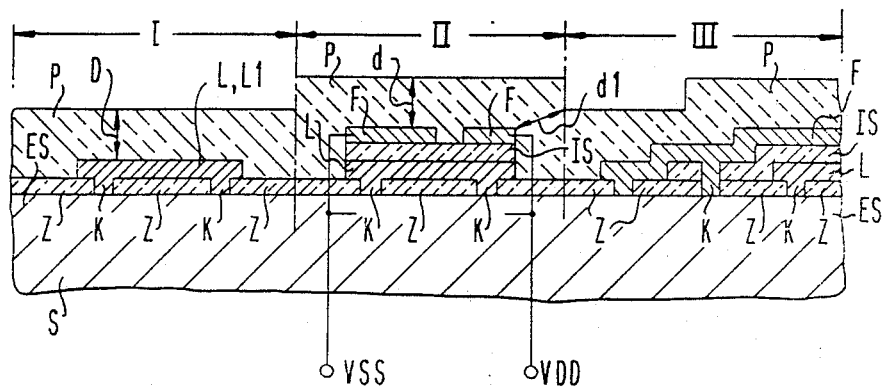

According to FIG. 2, a further advantageous embodiment of the invention provides two areas (I, II, III) in an integrated semiconductor circuit, the first area I of which is free of surface elements F, and the second area II, III of which contains the surface elements F. In this case, the first area I contains a security logic circuit and/or circuit parts which are basically necessary for the proper operation of the integrated semiconductor circuit, independently of a security logic circuit. For example, these may be so-called clock generators and/or substrate bias generator circuits. A security logic circuit is understood to be a circuit which, in order to activate the remaining parts of the integrated semiconducting circuit, requires data which must be fed to the integrated semiconductor circuit (Example: Typing-in a secret number when withdrawing cash by means of an automatic teller machine and an correspondingly prepaid identification card such as a check card) and if they are missing (for instance, as a function of the parameter "time") or if false data are fed-in, the operation of the integrated semiconductor circuit is blocked.

According to the invention, the electrical structures ES of the second area II, III contain circuit parts, the conductor runs L thereof which are associated therewith and are in contact therewith (ES) having logic levels relevant for the integrated semiconductor circuit or possibly its memory content.

The foregoing is a description corresponding in substance to German Application P 35 37 590.6, dated Oct. 22, 1986, the International priority of which is being claimed for the instant application, and which is hereby made part of this application. Any material discrepancies between the foregoing specification and the aforementioned corresponding German application are to be resolved in favor of the latter.

I claim:

1. Integrated semiconductor circuit, comprising a substrate, a layer of electrical structures disposed in said substrate; conductor runs connected to said electrical structures; at least one electrically conducting surface element covering only a part of said conductor runs; an insulating layer electrically insulating said at least one surface element from said part of said conductor runs being covered by said surface element; a passivating layer covering said substrate, said electrical structures, said conductor runs and said at least one surface element; said at least one surface element having at least the same thickness and the same chemical properties as said conductor runs; and said passivating layer being at least as thick above said at least one surface element covering said part of the conductor runs as above the remaining conductor runs; wherein said at least one surface element is in the form of a plurality of surface elements and at least one of said surface elements is electrically insulated.

2. Integrated semiconductor circuit, comprising a substrate; a layer of electrical structures disposed in said substrate; conductor runs connected to said electrical structures; at least one electrically conducting surface element covering only a part of said conductor runs; an insulating layer electrically insulating said at least one surface element from said part of said conductor runs being covered by said surface element; a passivating layer covering said substrate, said electrical structures, said conductor runs and said at least one surface element; said at least one surface element having at least the same thickness and the same chemical properties as said conductor runs; and said passivating layer being at least as thick above said at least one surface element covering said part of the conductor runs as above the remaining conductor runs; wherein said at least one surface element is in the form of a plurality of surface elements and at least one of said surface elements is connected to a potential serving as a voltage supply for the semiconductor circuit.

3. Integrated semiconductor circuit, comprising a substrate; a layer of electrical structures disposed in said substrate; conductor runs connected to said electrical structures; at least one electrically conducting surface element covering only a part of said conductor runs; an insulating layer electrically insulating said at least one surface element from said part of said conductor runs being covered by said surface element; a passivating layer covering said substrate, said electrical structures, said conductor runs and said at least one surface element; said at least one surface element having at least the same thickness and the same chemical properties as said conductor runs; and said passivating layer being at least as thick above said at least one surface element covering said part of the conductor runs as above the remaining conductor runs; wherein said at least one surface element is in the form of a plurality of surface elements and several of said surface elements are connected to each other.

4. Integrated semiconductor circuit, comprising a substrate; a layer of electrical structures disposed in said substrate; conductor runs connected to said electrical structures; at least one electrically conducting surface element covering only a part of said conductor runs; an insulating layer electrically insulating said at least one surface element from said part of said conductor runs being covered by said surface element; a passivating layer covering said substrate, said electrical structures, said conductor runs and said at least one surface element; said at least one surface element having at least the same thickness and the same chemical properties as said conductor runs; and said passivating layer being at least as thick above said at last one surface element covering said part of the conductor runs as above the remaining conductor runs; wherein said at least one surface element is in the form of a plurality of surface elements including first and second surface elements, said first surface element is connected to a first potential serving as a voltage supply for the semiconductor circuit and said second surface element is connected to a second potential serving as a second voltage supply for the semiconductor circuit.

5. Integrated semiconductor circuit according to claim 4, wherein said insulating layer has contact holes therethrough, and wherein said at least one surface element is connected to said part of said electrical structures through said contact holes.

6. Integrated semiconductor circuit, comprising a substrate; a layer of electrical structures disposed in said substrate; conductor runs connected to said elelctrical structures; at least one electrically conducting surface element covering only a part of said conductor runs; an insulating layer electrically insulating said at least one surface element from said part of said conductor runs being covered by said surface element; a passivating layer covering said substrate, said electrical structures, said conductor runs and said at least one surface element; said at least one surface element having at least the same thickness and the same chemical properties as said conductor runs; and said passivating layer being at least a thick above said at least one surface element covering said part of the conductor runs as above the remaining conductor runs; wherein said at least one surface element is in the form of a plurality of surface elements, at least one of said surface elements being a conductor connected to part of said electrical structures.

7. Integrated semiconductor circuit according to claim 6, including an intermediate oxide layer between said at least one surface element and said electrical structures, wherein said intermediate oxide layer has contact holes therethrough.

* * * * *